United States Patent [19]

George

[11] 4,281,349
[45] Jul. 28, 1981

[54] POWER SUPPLY ARRANGEMENT FOR A TUNING SYSTEM

[75] Inventor: John B. George, Indianapolis, Ind.

[73] Assignee: RCA Corporation, New York, N.Y.

[21] Appl. No.: 145,317

[22] Filed: Apr. 29, 1980

[51] Int. Cl.³ ............................................. H04N 5/44
[52] U.S. Cl. ................................. 358/191.1; 455/185; 455/343
[58] Field of Search ................ 358/191, 193; 455/185, 455/186, 343

[56] References Cited

U.S. PATENT DOCUMENTS

| 3,974,452 | 8/1976 | Cunningham | 455/343 |
| 4,137,502 | 1/1979 | Maddaloni | 455/343 |
| 4,181,891 | 1/1980 | Skerlos | 455/185 |

OTHER PUBLICATIONS

"On Powering Down," *Electronics*, p. 131, Apr. 26, 1979.
"*Intel Component Data Catalog*," 1978, pp. 4-51 to 4-54.
"Power Switching CKTS Cut PROM Power," *EDN* Magazine 5-20-80, pp. 127-130.
"Mostek 1979 Memory Data Book," pp. 171-175.
"Intel Data Sheet," pp. 3-138 to 3-143, *Intel Component Data Catalog, 1978*.

Primary Examiner—Richard Murray
Attorney, Agent, or Firm—Eugene M. Whitacre; Paul J. Rasmussen; Peter M. Emanuel

[57] ABSTRACT

A tuning system of a television receiver includes a nonvolatile memory for storing tuning information. Control apparatus allows memory locations of the memory to be selectively programmed during a set-up procedure for tuning respective channels and thereafter to be selectively interrogated during channel selection. A power supply for providing a supply voltage for the memory includes apparatus for maintaining the magnitude of the supply voltage at a relatively low level when the receiver is on but the tuning system is dormant, and for increasing the magnitude of the supply voltage to a change-enabling level for a predetermined time after the operation of switches for enabling the memory to be programmed during set-up and interrogated during channel selection.

13 Claims, 1 Drawing Figure

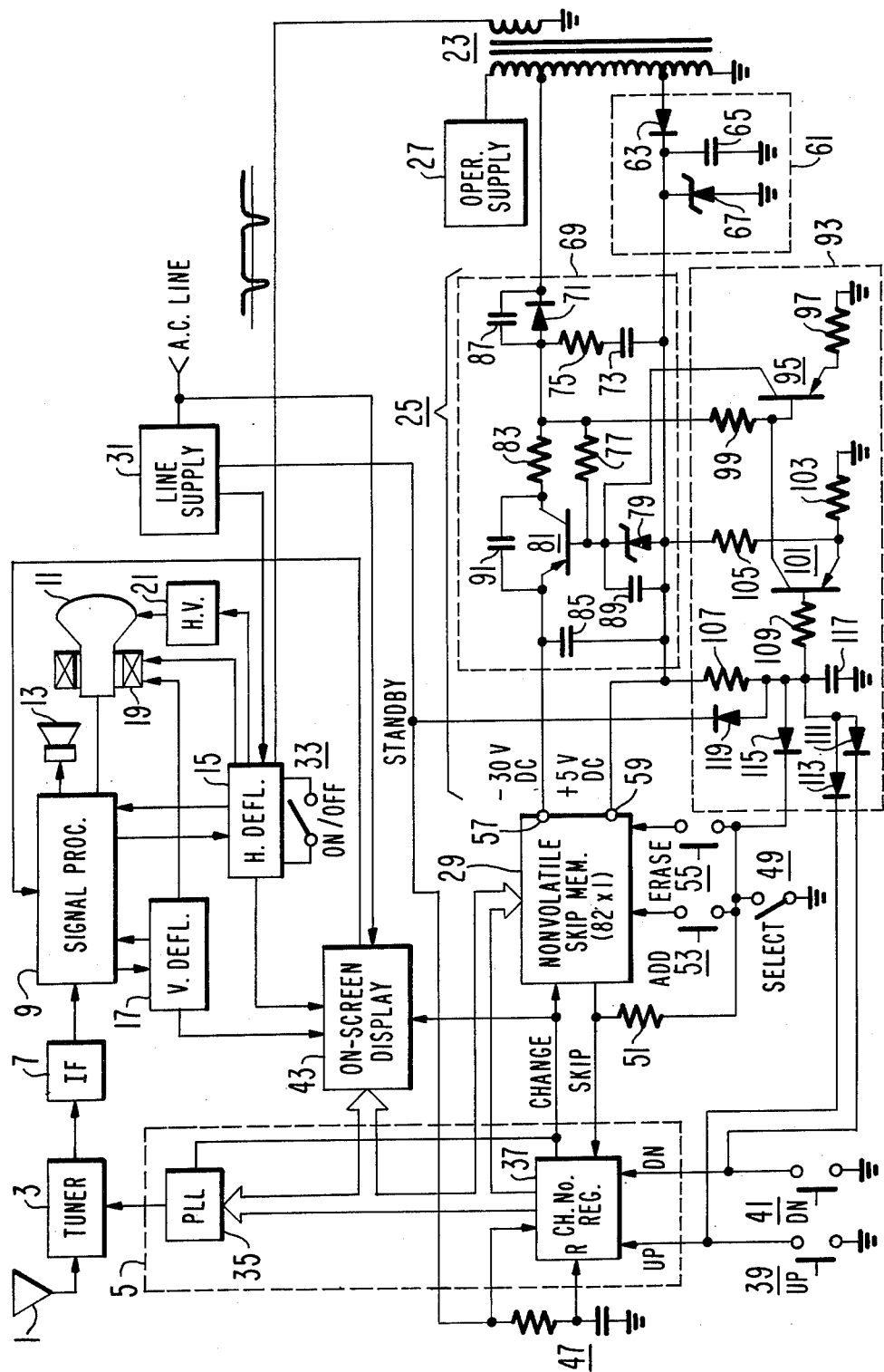

POWER SUPPLY ARRANGEMENT FOR A TUNING SYSTEM

BACKGROUND OF THE PRESENT INVENTION

The present invention concerns a power supply arrangement for an electronic tuning system.

A variety of electronic tuning systems for radio and television are known. A number of these include a non-volatile memory for storing information for tuning various channels. The contents of memory locations within the memory are programmed with tuning information for respective channels during a set-up procedure. When a channel is selected the appropriate memory location is addressed, and its contents are read out and used to tune the receiver to the selected channel.

Since non-volatile memories are capable of retaining information almost indefinitely without power, it is not necessary to preprogram again after a period in which the receiver has been off or disconnected from the line. A non-volatile memory often includes an integrated circuit array of metal-nitride-oxide-semiconductor (MNOS) memory cells.

The power supply voltage applied to the memory is selected to enable the memory to be programmed during set up and to be interrogated during channel selection. For MNOS non-volatile memories the magnitude of the power supply voltage required for these purposes is in the order of 30 volts. When the memory is not being programmed or interrogated, no power supply voltage is needed to maintain the information in the memory; so a considerable amount of power is wasted. In addition, the uninterrupted maintenance of a high supply voltage tends to reduce the reliability of such memories.

The present invention concerns a power supply arrangement for a tuning system including apparatus for reducing the magnitude of a supply voltage for the tuning system during dormant periods when tuning information for the selection of channels is not being changed.

In a preferred embodiment of the present invention, in a tuning system including a non-volatile memory for storing tuning information, control apparatus is provided in a power supply arrangement for normally maintaining the magnitude of the supply voltage for the memory at a relatively low level and for increasing the magnitude of the power supply voltage to a higher change-enabling level when the memory is interrogated during channel selection or when the contents of the memory are being programmed. Desirably, the low level is selected at a compromise value to provide both for relatively short switching times between dormant and active states and for relatively low power consumption during the dormant state.

The sole FIGURE of the drawing is a schematic of a television receiver, partly in block form, including a tuning system with a power supply arrangement constructed in accordance with the present invention.

In the sole FIGURE, an antenna 1 applies RF carriers in the television range to a tuner 3. Tuner 3 filters the RF carriers to select the carrier corresponding to a selected channel and heterodynes it with an internally generated local oscillator signal having a frequency with predetermined offset from that of the selected channel carrier to derive an IF signal. Tuner 3 is controlled in response to a tuning voltage generated by a frequency synthesizer 5, to be described in greater detail below.

The IF signal is filtered and amplified by an IF section 7. Picture and sound components of the IF signal are processed by a signal processing unit 9 and applied to a picture tube 11 and a speaker 13, respectively. Horizontal and vertical synchronizing pulses derived from the picture component are processed by horizontal and vertical deflection units 15 and 17 to form horizontal and vertical deflection signals, respectively. The deflection signals are applied to a deflection coil 19 to deflect electron beams produced by picture tube 11 horizontally and vertically across the screen of picture tube 11 to form an image.

The horizontal deflection signal has trace intervals, during which the electron beams are caused to scan horizontally across the screen to produce an image, and has much shorter retrace intervals, during which the electron beams are caused to be rapidly rescanned horizontally to a starting position. The vertical deflection signal has similar trace and retrace intervals for the vertical direction. Horizontal and vertical deflection units 15 and 17 generate respective blanking pulses which are applied to signal processing unit 7 to inhibit the generation of the electron beams during the retrace intervals so that rescan lines will not be visible.

During the horizontal retrace interval, horizontal deflection unit 15 generates a short, high-amplitude, negative-going pulse commonly known as the horizontal retrace of "flyback" pulse. This horizontal retrace pulse is applied to a high voltage supply 21 for picture tube 11. The horizontal retrace pulse is also applied through a transformer 23 to power supply arrangements 25 and 27 which generate supply voltages for various portions of the receiver in response to the horizontal retrace pulse. Power supply arrangement 25, with which the present invention is concerned, provides supply voltages to a memory 29 associated with frequency synthesizer 5. The remaining power supply arrangement for providing supply voltages for other parts of the receiver is indicated by block 27.

Regulation of all the supply voltages for the receiver is readily achieved by a single regulator included within horizontal deflection unit 15 for regulating the amplitude and duration of the horizontal retrace pulses. Since such a regulator is needed anyway for the deflection operation, there is a component saving compared with a power supply system in which the operating voltages are derived from the a.c. line voltage. Horizontal deflection systems including arrangements for deriving supply voltages for a television receiver are described in: U.S. Pat. No. 4,104,567, entitled "Television Raster Width Regulation Circuit," issued in the name of Peer et al on Aug. 1, 1978; U.S. Pat. No. 4,127,875, entitled "Inrush Current Start-Up Circuit for a Television Receiver," issued in the name of Fernsler et al on Nov. 28, 1978; and U.S. Pat. No. 4,147,964, entitled "Complementary Latching Disabling Circuit," issued in the name of Luz et al on Apr. 3, 1979, which are incorporated by reference.

Supply voltages for horizontal deflection unit 15 are derived from the a.c. line voltage by a line power supply 31. An on/off control, shown simply as a switch 33, for the receiver is coupled to horizontal deflection unit 13, rather than to line supply 31, so that standby voltages for frequency synthesizer 5 are provided even when the receiver is off. The on/off switching function is provided by enabling and disabling a horizontal oscillator (not specifically shown) within horizontal deflection unit 15 employed in the generation of the horizontal deflection signals.

Frequency synthesizer 5 includes a phase-locked loop 35 for generating the tuning voltage in response to binary signals representing the channel number of the selected channel. The binary signals representing the selected channel are stored in a channel number register 37. A frequency synthesizer for generating a tuning voltage for a television tuner of the same type is disclosed in detail in U.S. Pat. No. 4,031,549, entitled "Television Tuning System with Provisions for Receiving RF Carriers at Nonstandard Frequency" issued in the name of Rast et al on June 21, 1977, which is incorporated by reference.

Channel number register 37 includes an up/down counter arrangement (not specifically shown) responsive to the depression of UP and DN (Down) channel selection pushbuttons 39 and 41, respectively, for making channel selections. When UP pushbutton 39 is depressed, ground potential is applied to an UP input of register 37 which causes the stored channel number to increase. When DN pushbutton 41 is depressed, ground potential is applied to a DN input of register 37 which causes the stored channel number to decrease. When either of pushbuttons 39 or 41 is depressed, a CHANGE signal is generated which conditions PLL 35 to respond to the new contents of channel number register 37.

The contents of channel number register 37 are applied to an on-screen display unit 43. On-screen display unit 43 modulates the picture component processed by signal processing unit 9 in accordance with the contents of register 37 to form the channel number of the selected channel in an area of the image. On-screen display unit 43 receives timing signal from horizontal deflection unit 15 and vertical deflection unit 17 to form and position the channel number on the image. An on-screen display unit of the same type is disclosed in detail in U.S. Pat. No. 3,984,828, entitled "Character Generator for Television Channel Number Display with Edging Provisions," issued in the name of Beyers, Jr., on Oct. 5, 1976, which is incorporated by reference.

On-screen display unit 43 includes a counter (not specifically shown) enabled in response to the CHANGE signal to count a predetermined number of cycles of a reference frequency signal to establish a predetermined time period, e.g., 5 seconds, during which the channel number of the selected channel is displayed. After the predetermined time period, display of channel number is ended. The reference frequency signal may be derived from the vertical deflection signal. Alternately, the reference frequency signal may be derived from the a.c. line voltage. The latter is particularly desirable if on-screen display unit 43 includes provisions for displaying the time as well as the presently selected channel. An on-screen display unit of this type is employed in CTC-93 chassis manufactured by RCA Corporation, Indianapolis, Ind. The CTC-93 chassis is described in "RCA Television Service Data—Chassis CTC-93 Series," File 1978 C-7, published by RCA Corporation, Indianapolis, Ind., which is incorporated by reference.

The contents of channel number register 37 are also applied to skip memory 29. Skip memory 29 includes a single bit memory location for each channel that may be selected (e.g., in the United States, 82 memory locations are needed for the 82 channels between channels 2 and 83). Each memory location is programmed, as described below, to store either a binary "1" or a binary "0." A binary "1" indicates that the corresponding channel is not desired, e.g., because it has poor reception characteristics or has unacceptable program content. A binary "0" indicates the corresponding channel is desired. The memory locations are addressed in response to the contents of channel number register 37 when the CHANGE signal is generated. When an addressed memory location contains a binary "1," a SKIP signal is applied to channel number register 37 which causes its contents to be changed, i.e., increased if UP pushbutton 39 has been depressed and decreased if DN pushbutton 41 has been depressed, until a memory location containing a binary "0" is reached.

Memory 29 is a non-volatile EAROM (Electronically Alterable Read Only Memory) comprising, e.g., an integrated circuit array of MNOS memory cells. Such a non-volatile memory is described in an article entitled "Digital Television Tuner Uses MOS LSI and Nonvolatile Memory" by Penner appearing in "Electronics," dated Apr. 1, 1976, incorporated by reference. The information stored in a non-volatile memory is maintained even in the complete absence of supply voltage.

Unlike nonvolatile skip memory 29, the contents of channel number register 37 will not be maintained without a supply voltage. Therefore a supply voltage generated by line supply 31 is applied to channel number register 37 so that its contents are maintained when the receiver is off. As a result, when the receiver is turned on again, the last channel selected before the receiver was turned off will automatically be tuned.

However, if the receiver is disconnected from the a.c. line or the line voltage temporarily drops for a predetermined period, e.g., 2 seconds, e.g., during a lightning storm, the contents of channel number register 37 will not be maintained. Under these conditions, after power is returned, power up detector 45, shown simply as comprising a resistor and a capacitor, generates a negative-going RESET pulse. In response to the RESET pulse, channel number register 37 is reset to a predetermined condition corresponding to a predetermined channel number, e.g., 2. As a result, the corresponding memory location of memory 29 is addressed. If a binary "0" is stored in the addressed memory location, the contents of channel number register 37 are maintained and the corresponding channel is tuned. If a binary "1" is stored, the contents of channel number register are changed until a desired channel is located. Thus, if power has been removed, after power is returned, the first, desired channel in a predetermined order, e.g., increasing, is tuned.

To program skip memory 29, a single pole, single throw switch 49, labelled SELECT, is closed. This causes the non-desired channel skipping feature to be defeated to enable all channels, whether or not previously programmed to be skipped, to be selected. Specifically, when SELECT switch 49 is closed, the SKIP line is connected to ground through resistor 51. This prevents a high voltage level corresponding to a binary "1" to be developed on the SKIP line. As a result, if a binary "1" is stored in an addressed memory location, it is reduced to a binary "0" level and the corresponding channel will not be skipped, enabling its programming to be changed. Once a memory location is addressed by depressing either UP pushbutton switch 39 of DN pushbutton switch 41, a binary "0" is entered by depressing an ADD pushbutton 53 or a binary "1" is entered by depressing an ERASE pushbutton 55. If neither of pushbuttons 53 and 55 is depressed when SELECT switch 49 is closed, the programming of the selected channel is unchanged.

When nonvolatile skip memory 29 is being interrogated during channel selection and programmed during set-up, a relatively large supply voltage difference, −35 v.d.c. must be provided across its power supply terminals 57 and 59. Aside from these times, no supply voltage need be provided to skip memory 29. Power supply arrangement 25 selectively provides the required supply voltage difference of −35 v.d.c. across power supply terminals 57 and 59 in active periods when memory 29 is being interrogated during channel selection or being programmed during set-up and reduces the supply voltage difference to −5 v.d.c. in dormant or stable periods or times when information in the tuning is not being changed. This conserves operating power. Moreover, it also tends to improve the reliability of nonvolatile skip memory 29 because it lessens its heat dissipation. Although no standby voltage for nonvolatile skip memory 29 is required whatsoever during the dormant periods, the supply voltage difference is not reduced completely to shorten the switching times between dormant and active states. In addition, the maintenance of the supply voltage for skip memory 29 at −5 v.d.c. in dormant periods maintains semiconductor portions of skip memory 29 connected to frequency synthesizer 5 at relatively high impedance levels which will not unduly load frequency synthesizer 5.

Power supply 25 includes a positive voltage supply 61 for supplying a relatively low magnitude, positive voltage, e.g., +5 v.d.c., to supply terminal 59 of nonvolatile skip memory 29. Positive voltage supply 61 includes a rectifying diode 63 poled to charge a filter capacitor 65 in response to positive-going portions of the horizontal retrace pulses applied to positive voltage supply 61 through transformer 23. A Zener diode 67 shunting filter capacitor 65 and poled to conduct in its reverse-bias avalanche region, provides regulation at +5 v.d.c.

Power supply 25 also includes a negative voltage supply 69 for supplying, when enabled as described below, a relatively high magnitude, negative voltage, e.g., −30 v.d.c. to terminal 57. Negative voltage supply 69 includes a rectifying diode 71 poled to charge a filter capacitor 73 in response to negative-going portions of horizontal retrace pulses. A current-limiting resistor is connected in series with capacitor 73 to limit the current surge into it when the receiver is first turned on. The voltage developed at the anode of diode 71 is applied through a bias resistor 77 to a diode 79 poled to conduct in its reverse-bias avalanche region. A PNP transistor 81 has its collector connected to the junction of diode 71 and resistor 75 through a current limiting resistor 83, its base connected to Zener diode 79 and its emitter connected to supply terminal 57. A second filter capacitor 85 shunts the series connection of the base-emitter junction of transistor 81 and Zener diode 79. Zener diode 79 determines the voltage developed at the base of transistor 81 and thereby determines the voltage developed at terminal 57.

The above described arrangement is a series regulator which is well suited for providing a wide range, e.g., 2 to 1, of currents demanded by non-volatile skip memory 29 at the negative supply voltage during operating periods. In this arrangement, transistor 81 is a pass transistor for transferring charge from capacitor 73 to capacitor 85. Transistor 81 conducts until capacitor 85 is charged to approximately −30 v.d.c. at which time its base-to-emitter junction is reverse-biased. As a result, the current supplied by power supply 69 is automatically adjusted in accordance with the load current demanded. The amount of current supplied to Zener diode 79 is substantially independent of the current demanded. Therefore, at low load current demands, little more than the bias current for Zener diode 79 is required. In comparison, if a Zener diode connected as a shunt regulator were simply employed, the current applied to the Zener would have to be sufficient to bias it into its reverse-bias avalanche region at the highest load current demand. In this latter arrangement, at the low-load current demands, the Zener diode absorbs the current in excess of its required bias current. Therefore, with a simple Zener regulator the current supplied would not be dependent on the demand and at low load current demands power is wasted.

As referred to above, power supply 69 is selectively activated only during active periods. To discharge voltages developed across semiconductor junctions to minimize the switching times, capacitors 87, 89 and 91 are connected across diode 87, Zener diode 79 and the collector-emitter path of transistor 81, respectively.

Typical component values for power supply 69 for providing −30 v.d.c. at terminal 57 in response to a volt negative peak pulse occurring periodically at 62.5 microseconds are listed in the following table.

| COMPONENT | VALUE |
| --- | --- |
| Capacitor 73 | 10 microfarads |
| Resistor 75 | 220 ohms |
| Resistor 77 | 8200 ohms |
| Zener diode 79 | 36 volts |
| Resistor 83 | 47 ohms |
| Capacitor 85 | 68 microfarads |
| Capacitor 87 | 0.001 microfarads |
| Capacitor 89 | 0.01 microfarads |
| Capacitor 91 | 0.01 microfarads |

Negative power supply regulator 29 is selectively enabled and disabled from supplying −30 v.d.c. to terminal 57 by a switching circuit 93. Switching circuit 93 includes a PNP transistor 95 having a collector-to-emitter path connected in series with a relatively low value, e.g., 100 ohms, resistor 97 between the base of pass transistor 81 and signal ground. A relatively large value, e.g., 100 kilohms, bias resistor 99, connected between the base of transistor 95 and the junction of diode 71 and resistor 75, normally allows a negative voltage sufficient to render transistor 95 conductive at the base of transistor 95. As a result, Zener diode is effectively shunted by the conductive collector-to-emitter path of transistor 95 and resistor 97. This causes a negative voltage, e.g., −0.3 v.d.c., to be developed across Zener diode 81 which is of relatively low magnitude compared to the voltage, e.g., −35 v.d.c., developed across Zener diode 79 when transistor 95 is not conductive. Under these conditions transistor 81 is essentially non-conductive and a relatively low magnitude negative voltage, substantially equal to −5 v.d.c., is developed between power supply terminals 57 and 59.

The base of transistor 95 is selectively connected to ground through the collector-to-emitter path of a PNP transistor 101 and a resistor 103. A bias resistor 105 is connected between the +5 v.d.c. line and the emitter of transistor 101. Bias resistors 107 and 109, connected between the +5 v.d.c. line and the base of transistor 101, normally maintain transistor 101 non-conductive so transistor 95 is conductive. Diodes 111, 113 and 115 are connected between the un-grounded sides of switches 39, 41 and 49, respectively, and the junction of resistors 107 and 109. Diodes 111, 113 and 115 are poled so as to conduct when respective ones of switches 39, 41 and 49 are closed. Thus, when any one of UP switch 39, DN switch 41 and SELECT switch 49 is closed, a voltage near ground potential is applied to the base of transistor 101. This causes transistor 101 to be conductive and transistor 95 to be non-conductive. As a result, the Zener voltage, e.g., −36 v.d.c., is applied to the base of transistor 81 and −30 v.d.c. is developed at terminal 57. Thus, when either UP switch 39 or DN switch 41 is depressed to initiate a channel change or when SELECT switch is closed to allow skip memory 29 to be programmed, −35 v.d.c. is applied between terminals 57 and 59.

Since capacitors 73 and 85 are large, it takes a relatively long time for the −30 v.d.c. to be developed in response to the horizontal retrace pulse. Accordingly, diodes 111, 113 and 115 are directly connected between switches 39, 41 and 49 and resistor 109 so that as soon as one of the switches is closed, power supply 69 is enabled to develop −30 v.d.c. This ensures that skip memory 29 will be in condition for the tuning process described above as needed.

A capacitor 117 is connected between the junction of resistor 105 and 107 and ground to control the duration of the time period in which the full supply voltage of −35 v.d.c. is applied to skip memory 29. Capacitor 109 is normally charged to the positive voltage developed at the junction of resistors 105 and 107 and is rapidly discharged to ground potential when one of switches 39, 41 or 49 is closed through the respective one of diodes 111, 113 and 115. After the closed one of switches 39, 41 or 49 is opened, capacitor 117 begins to charge. Until the voltage across capacitor 117 reaches a threshold voltage, determined by resistors 103, 105, 107 and 109, transistor 101 is conductive and transistor 95 is non-conductive. As a result, the voltage developed between power supply terminals 57 and 59 is at −35 v.d.c. for a predetermined period, determined by capacitor 117, and resistors 103, 107 and 109, after a closed one of switches 39, 41 and 49 is opened.

The predetermined time period in which −35 v.d.c. is applied across power terminals 57 and 59 of skip memory 29 after a closed one of switches 39, 41 and 49 is opened is selected as a time period, e.g., 6 seconds, longer than the display time of the on-screen channel display, e.g., 5 seconds. This is desirable since it has been found that, without the selected predetermined time period, if switching of negative power supply regulator 69 occurs during the period of the on-screen display, the corresponding change in the loading of horizontal deflection unit 15 causes horizontal shifts in the position of the channel number display. Although the loading change has been found not to appreciably affect the image, the shift in the position of the channel number display is quite noticeable. However, in the present arrangement, since the predetermined time period during which the full supply voltage is applied to skip memory 29 is longer than the predetermined time period during which the channel number is displayed on the screen, undesirable shifts of the channel number display due to changes of the loading of horizontal deflection unit 15 as the supply voltage for skip memory 29 is reduced are not appreciably noticeable.

A diode 119 is connected between the standby voltage line and capacitor 117 and poled to cause capacitor 117 to be discharged when the standby voltage falls to a level near signal ground during the absence of the a.c. line voltage. As a result, when the a.c. line voltage returns, and for the predetermined time period thereafter required for capacitor 117 to be recharged to the predetermined threshold associated with transistor 101, transistor 101 will be conductive and transistor 95 will be non-conductive. This causes the full −35 v.d.c. to be applied between supply terminals 57 and 59. This is desirable since it enables skip memory 29 to be interrogated in order to locate the first non-skipped channel for a predetermined time period after line voltage is initially applied or reapplied to the receiver as described above. Since the predetermined time period, e.g., 6 seconds, is long, there is more than ample time for the tuning system to locate the first non-skipped channel. While diode 119 is shown as being connected to the same standby voltage line to which channel number register 37 is connected, it may of course be connected to another standby voltage line.

While the present invention concerning power supply for a non-volatile memory with provisions for reducing the magnitude of the supply voltage when the memory is not being interrogated or programmed has been described in terms of a preferred embodiment in which two differential supply voltages are supplied and the magnitude of one is substantially reduced to zero, it also has applicability to embodiments where only a single supply voltage is supplied. However, by employing a differential supply arrangement one supply voltage can be maintained while the other is disabled, to readily provide an intermediate magnitude supply voltage which is a compromise between low power consumption and short switching times. In addition, while it is desirable to maintain the supply voltage at some magnitude below the activation magnitude but above the off level, i.e., zero volts, for short switching times, it should be noted that since the memory is non-volatile, the supply voltage or voltages can be completely defeated during dormant periods where switching times are of no particular concern. These and other modifications are intended to be within the scope of the present invention defined by the following claims.

What is claimed is:

1. In a receiver, apparatus comprising:

tuning means for tuning said receiver to various channels;

power supply means for supplying at least one supply voltage to said tuning means;

tuning control means coupled to said tuning means for controlling said tuning means to change conditions of said tuning means associated with the selection of channels; and power supply control means coupled to said power supply means and said tuning control means for normally causing the magnitude of said supply voltage to be at a relatively low level and for selectively causing the magnitude of said supply voltage to be at a level sufficiently higher than said low level to enable said channel selection conditions to be changed when said tuning control means is operated.

2. The apparatus recited in claim 1 wherein:

said tuning means includes a non-volatile memory for storing channel selection information;

said power supply means supplies said supply voltage to said non-volatile memory; and said power supply control means causes the magnitude of said supply voltage to equal substantially zero volts unless said tuning control means is operated.

3. The apparatus recited in claim 2 wherein:

power supply means first and second means for supplying first and second power supply voltages of opposite polarities to said non-volatile memory, said second supply voltage having a magnitude substantially lower than the magnitude of said first supply voltage; and said power supply control means reduces the magnitude of said first supply substantially to zero volts when said tuning control means is not operated and does not substantially affect the magnitude of said second supply voltage when said tuning control means is not operated.

4. The apparatus recited in claim 1 wherein:

said tuning control means includes a channel-changing switch for selectively causing said tuning means to tune a different channel than that presently tuned when it is operated; and said power supply control means is connected to said channel-changing switch to increase the magnitude of said supply voltage from said lower level to said change-enabling level in direct response to the operation of said channel changing switch.

5. The apparatus recited in claim 4 wherein:

said tuning means includes a memory including a plurality of memory locations for storing tuning information for respective channels; address means for addressing said memory locations to retrieve tuning information stored therein in response to the operation of said channel-changing means; and said power supply means supplies said first supply voltage to said memory.

6. The apparatus recited in claim 5 wherein:

said tuning control means includes a memory-changing switch coupled to said memory for selectively enabling the contents of an addressed one of said memory locations to be changed when operated; and said power supply control means is connected to said memory-changing switch to increase the magnitude of said supply voltage from said lower level to said change-enabling level in direct response to the operation of said memory-changing switch.

7. The apparatus recited in claim 1 wherein:

said tuning means includes counter means for generating a coded group of binary signals representing the channel number of a selected channel, converter means for generating a tuning signal having a magnitude corresponding to the group of binary signals generated by said counter means, at least one tuning circuit having a frequency response controlled in response to the magnitude of said tuning signal, and memory means including a plurality of memory locations addressed in response to the said binary signals generated by said counter means for storing a skip signal for each one of said channels having either a first or a second level even in the absence of said supply voltage; said counter means receiving said skip signals and generating the group of binary signals representing the next channel when one of said skip signals has said second level;

said tuner control means includes at least one channel-changing switch coupled to said counter for selectively changing the contents of said counter means when operated, and a memory-changing switch coupled to said counter for enabling the skip signal stored in an addressed one of said memory locations to be changed to either of said first and second levels when it is operated; and said power supply control means is connected to said channel-changing switch and to said memory-changing switch to increase the magnitude of said supply stage from said lower level to said change enabling level in direct response to the operation of either of said channel-changing or said memory-changing switch.

8. The apparatus recited in claim 7 wherein:

said receiver further includes: main power supply means for generating at least one operating voltage for said receiver from a.c. line voltage; and wherein said tuning means includes means for setting the contents of said counter to a predetermined condition when the magnitude of said operating voltage changes from a predetermined low level to a predetermined high level; and said power supply control means includes initialization means responsive to said operative voltage for increasing the magnitude of said supply voltage from said lower level to said change enabling level when the magnitude of said operating voltage changes from said predetermined low level to said predetermined high level.

9. The apparatus recited in claim 8 wherein:

said power supply control means includes: time delay means for maintaining said supply voltage at said change enabling level for a predetermined time after one of said channel changing or memory changing switches is operated, with predetermined time being longer than the time required for the contents of said counter means to address a first one of said memory locations containing a skip signal having said first level.

10. In a television receiver including a picture tube for generating an electron beam; signal processing means for generating a video signal for modulating said electron beam; horizontal and vertical deflection means for generating horizontal and vertical deflection signals to deflect said electron beam to form an image; tuning register means for storing binary signals representing a selected channel; channel selection means for changing the binary signals stored in said register means when operated; converter means for converting said binary signals to a tuning voltage; frequency selective means responsive to said tuning voltage for tuning said television receiver to various channels; and channel number display means responsive to said deflection signals for displaying the channel number of said selected channel in a predetermined portion of said image for a display time after said selected channel is selected; apparatus comprising:

power supply means for generating at least one supply voltage for said tuning means in response to one of said deflection signals; and power supply control means connected to said power supply means and said channel selection means for normally causing the magnitude of said supply voltage to be at a relatively low value and selectively causing the magnitude of said supply voltage to be a relatively high value for a predetermined time longer than said display time after said channel change selection means is operated and thereafter automatically causing the magnitude of said supply voltage to return to said relatively low value.

11. The apparatus recited in claim 10 wherein:
said power supply means includes a first capacitor connected at one end to a circuit point; rectifying means for charging said first capacitor in response to said deflection signal; a second capacitor connected at one end to said circuit point; a transistor having a collector-emitter path connected between the other ends of said first and second capacitors; and voltage regulation means for establishing a reference voltage at the base of said transistor in response to the voltage developed across said first capacitor; said supply voltage being developed across said second capacitor.

12. The apparatus recited in claim 11 wherein:
said power supply control means includes reduction means connected to the base of said transistor for reducing the voltage developed at said base for said predetermined time after said channel selection means is operated.

13. The apparatus recited in claim 12 wherein:
said tuning means includes a non-volatile memory for storing tuning information which is accessed in response to the binary signals stored in said register means;
said supply voltage is applied to said non-volatile memory; and
said reduction means renders said transistor non-conductive when said channel selection means is operated.

* * * * *